(12) United States Patent
Zhou

(10) Patent No.: US 11,189,711 B2
(45) Date of Patent: Nov. 30, 2021

(54) SEMICONDUCTOR STRUCTURES

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/921,019

(22) Filed: Jul. 6, 2020

(65) Prior Publication Data

US 2020/0335604 A1    Oct. 22, 2020

Related U.S. Application Data

(62) Division of application No. 16/113,067, filed on Aug. 27, 2018, now Pat. No. 10,741,670.

(30) Foreign Application Priority Data

Aug. 28, 2017    (CN) .......................... 201710748816.6

(51) Int. Cl.
*H01L 29/66*    (2006.01)
*H01L 21/02*    (2006.01)
(Continued)

(52) U.S. Cl.
CPC .... *H01L 29/66545* (2013.01); *H01L 21/0217* (2013.01); *H01L 21/02164* (2013.01);
(Continued)

(58) Field of Classification Search
CPC .......... H01L 21/0337; H01L 21/28123; H01L 21/28132; H01L 21/28141; H01L 21/3086;
(Continued)

(56) References Cited

U.S. PATENT DOCUMENTS 10,256,239 B2 * 4/2019 Pranatharthiharan ....................... H01L 21/823814
2016/0343858 A1 11/2016 Kim et al.
(Continued)

FOREIGN PATENT DOCUMENTS

| CN | 103515321 A | 1/2014 |
|---|---|---|
| CN | 106653847 A | 5/2017 |

*Primary Examiner* — David C Spalla
(74) *Attorney, Agent, or Firm* — Anova Law Group, PLLC

(57) ABSTRACT

A semiconductor device includes a semiconductor substrate; a plurality of semiconductor fin structures formed on the semiconductor substrate; a plurality of gate structures, each formed on a semiconductor fin structure; a source electrode and a drain electrode formed on two opposite sides of each gate structure, wherein, at least a portion of the source electrode and at least a portion of the drain electrode are formed in the semiconductor fin structure; a covering layer formed on the semiconductor fin structures and also on two side surfaces of each gate structure; and an interlayer dielectric layer formed on the covering layer, wherein the interlayer dielectric layer covers each source electrode and each drain electrode, a trench is formed in the interlayer dielectric layer to expose a portion of each semiconductor fin structure, and a gate structure is formed in each trench.

20 Claims, 13 Drawing Sheets

(51) Int. Cl.
H01L 21/3105 (2006.01)
H01L 21/311 (2006.01)
H01L 21/321 (2006.01)
H01L 21/3213 (2006.01)
H01L 21/762 (2006.01)
H01L 21/8238 (2006.01)
H01L 27/092 (2006.01)
H01L 29/06 (2006.01)
H01L 29/40 (2006.01)
H01L 29/417 (2006.01)
H01L 29/78 (2006.01)
H01L 21/265 (2006.01)

(52) U.S. Cl.
CPC .. *H01L 21/31053* (2013.01); *H01L 21/31144* (2013.01); *H01L 21/3212* (2013.01); *H01L 21/32139* (2013.01); *H01L 21/76224* (2013.01); *H01L 21/823821* (2013.01); *H01L 21/823828* (2013.01); *H01L 21/823857* (2013.01); *H01L 21/823871* (2013.01); *H01L 21/823878* (2013.01); *H01L 27/0924* (2013.01); *H01L 29/0649* (2013.01); *H01L 29/401* (2013.01); *H01L 29/41791* (2013.01); *H01L 29/7848* (2013.01); *H01L 21/26513* (2013.01); *H01L 21/76229* (2013.01); *H01L 21/823814* (2013.01)

(58) Field of Classification Search
CPC ..... H01L 21/823418; H01L 21/823431; H01L 21/823468; H01L 21/823814; H01L 21/823821; H01L 21/823864; H01L 21/845; H01L 27/0886; H01L 27/0924; H01L 27/10826; H01L 27/10879; H01L 27/1211; H01L 29/41791; H01L 29/6653; H01L 29/6656; H01L 29/66636; H01L 29/66795; H01L 29/7848; H01L 29/785
See application file for complete search history.

(56) References Cited

U.S. PATENT DOCUMENTS

2017/0125586 A1    5/2017  Lee et al.
2018/0138280 A1*   5/2018  Li ..................... H01L 29/66545
2018/0151378 A1*   5/2018  Huang ................. H01L 29/161

* cited by examiner

SEMICONDUCTOR STRUCTURES

CROSS-REFERENCES TO RELATED APPLICATIONS

This application is a divisional of U.S. patent application Ser. No. 16/113,067 filed on Jul. 26, 2018, which claims the priority of Chinese Patent Application No. CN201710748816.6, filed on Aug. 28, 2017, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

As the dimension of metal-oxide semiconductor field-effect transistor (MOSFET) devices is gradually reduced, the short channel effect (SCE) becomes a key issue. Fin field effect transistor (Fin-FET) device demonstrates desired gate-control ability in controlling charges in the channel, and thus the size of complementary metal oxide semiconductor (CMOS) device may be further reduced.

During the fabrication process of a Fin-FET device, a metal gate electrode may be used to replace a dummy gate electrode that is made of polycrystalline silicon, and a gate dielectric layer may be used to replace a dummy insulating layer. Therefore, during the fabrication process, the dummy gate electrode and the dummy insulating layer may be removed to form a trench such that the gate dielectric layer and the metal gate electrode can then be formed. However, during the etching process to remove the dummy insulating layer, the etching process may result in lateral etching of silicon oxides in the shallow trench isolation (STI), which may form gaps in silicon oxides to expose the source electrode and/or the drain electrode formed on the two opposite sides of the trench. Further, during the process to form a metal gate electrode in the trench, the formed metal gate electrode may easily fill into the gaps and thus may be connected to the source electrode and/or the drain electrode. As such, the reliability of the device may be degraded. The disclosed semiconductor devices and fabrication methods thereof are directed to solve one or more problems set forth above and other problems in the art.

BRIEF SUMMARY OF THE DISCLOSURE

One aspect of the present disclosure includes a method for fabricating a semiconductor structure. The method includes providing a semiconductor structure including a semiconductor substrate, a plurality of semiconductor fin structures on the semiconductor substrate, and a plurality of dummy gate structures each formed on a semiconductor fin structure and including at least a dummy insulating layer formed on the semiconductor fin structure and a dummy gate electrode formed on the dummy insulating layer; and forming a covering layer on the semiconductor structure. The covering layer includes a first portion formed on two side surfaces of each dummy gate structure and a second portion formed on the plurality of semiconductor fin structures. The method also includes forming a sacrificial layer on side surfaces of the first portion of the covering layer; forming a first trench and a second trench on two opposite sides of each dummy gate structure by etching the second portion of the covering layer and the semiconductor fin structure using the dummy gate structure and the sacrificial layer as an etch mask; forming a source electrode in each first trench and a drain electrode in each second trench; forming an interlayer dielectric layer to cover each dummy gate structure, each source electrode, and each drain electrode, performing a planarization process to expose a top surface of each dummy gate structure; and; and removing each dummy gate electrode and a portion of the dummy insulating layer to form a trench to expose a portion of the semiconductor fin structure.

Another aspect of the present disclosure provides a semiconductor device. The semiconductor device includes a semiconductor substrate; a plurality of semiconductor fin structures formed on the semiconductor substrate; a plurality of gate structures, each formed on a semiconductor fin structure; and a source electrode and a drain electrode formed on two opposite sides of each gate structure. At least a portion of the source electrode and at least a portion of the drain electrode are formed in the semiconductor fin structure. The semiconductor device further includes a covering layer formed on the semiconductor fin structures and also on two side surfaces of each gate structure. The covering layer includes a first portion formed on the two side surfaces of each dummy gate structure and a second portion formed on the plurality of semiconductor fin structures. The semiconductor device also includes an interlayer dielectric layer formed on the covering layer. The interlayer dielectric layer covers each source electrode and each drain electrode, a trench is formed in the interlayer dielectric layer to expose a portion of each semiconductor fin structure, and a gate structure is formed in each trench.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-5 illustrate schematic cross-section views of semiconductor structures at certain stages for fabricating a semiconductor device. FIG. 6C illustrates a schematic top view of a semiconductor structure at a certain stage for fabricating the semiconductor device.

Figure 1:
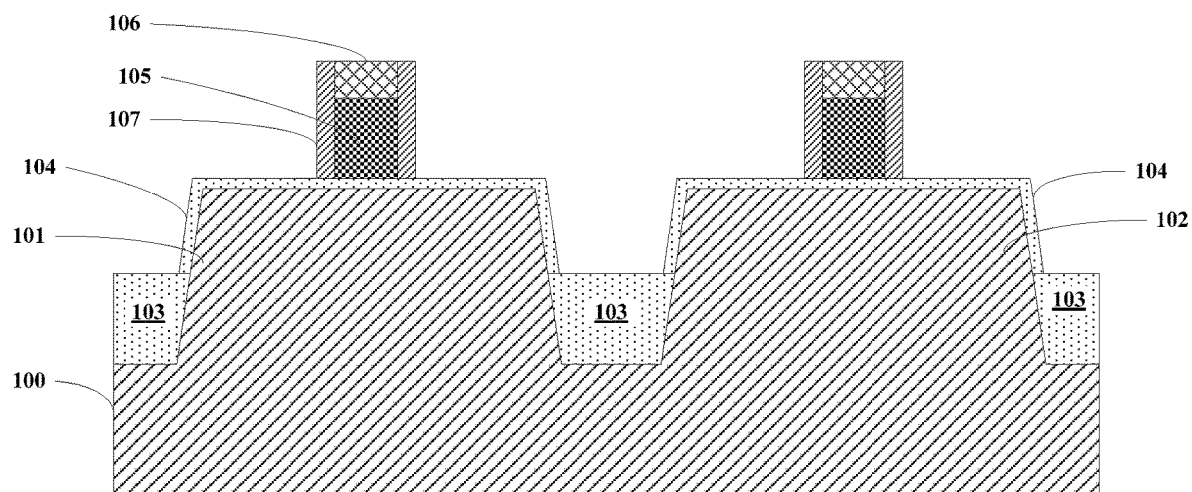
FIGS. 1-5, FIG. 6A, FIG. 6B, and FIG. 6C illustrate schematic views of semiconductor structures at certain stages of a conventional method for fabricating a semiconductor device.

According to the method for fabricating the semiconductor device, at the beginning of the fabrication process, a semiconductor structure is provided. FIG. 1 shows a schematic cross-section view of a corresponding semiconductor structure.

Referring to FIG. 1, a semiconductor structure is provided. The semiconductor structure includes a substrate 100, a first fin structure 101 and a second fin structure 102 formed on the substrate 100, a plurality of trenches surrounding the first fin structure 101 and the second fin structure 102, and a silicon oxide layer 103 filled into the trenches. The plurality of trenches and the silicon oxide layer 103 formed in the plurality of trenches together form a STI. The semiconductor structure also includes a dummy insulating layer 104 formed on the surfaces of the first fin structure 101 and the second fin structure 102, and two dummy gate electrodes 105 formed on the dummy insulating layer 104 corresponding to the first fin structure 101 and the second fin structure 102, respectively. The semiconductor structure further includes a hard mask layer 106 formed on each dummy gate electrode 105 and a sidewall spacing layer 107 formed on the side surfaces of each dummy gate electrode 105. In a subsequent process, the first fin structure 101 is used to form an N-channel metal-oxide-semiconductor (NMOS) device, and the second fin structure 102 is used to form a P-channel metal-oxide semiconductor (PMOS) device.

Figure 2:
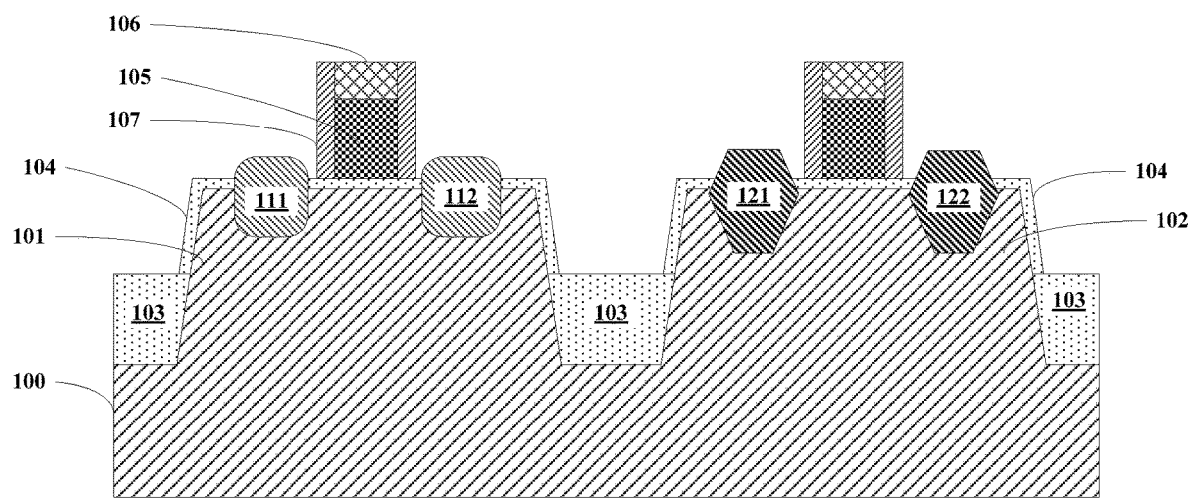

Further, referring to FIG. 2, a source electrode and a drain electrode are formed on the two opposite sides of each dummy gate electrode 105. For example, corresponding to a subsequently-formed NMOS device, a first source electrode 111 and a first drain electrode 112 are formed, and corresponding to a subsequently-formed PMOS device, a second source electrode 121 and a second drain electrode 122 are formed.

Figure 3:
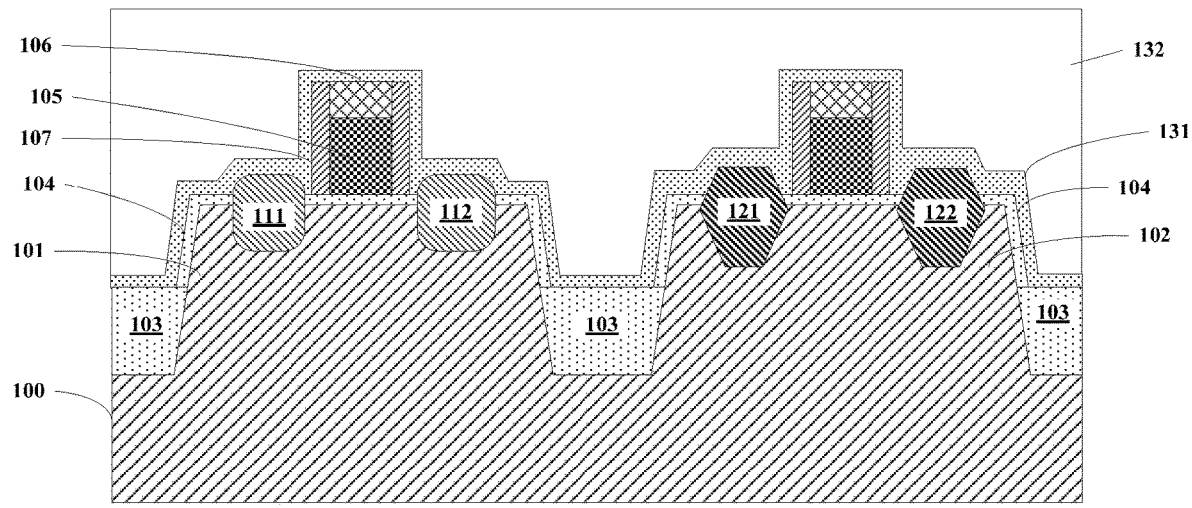

Referring to FIG. 3, an interlayer dielectric layer 132 is formed on the semiconductor structure shown in FIG. 2.

Figure 4:
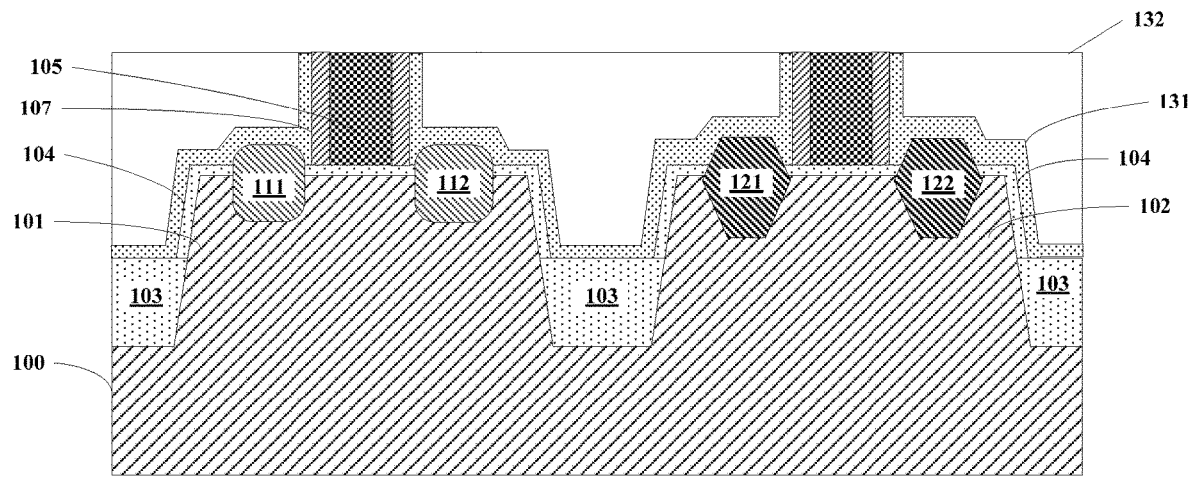

Referring to FIG. 4, further, a chemical mechanical planarization (CMP) process is performed on the semiconductor structure shown in FIG. 3 until the top surfaces of the dummy gate electrodes 105 are exposed.

Figure 5:
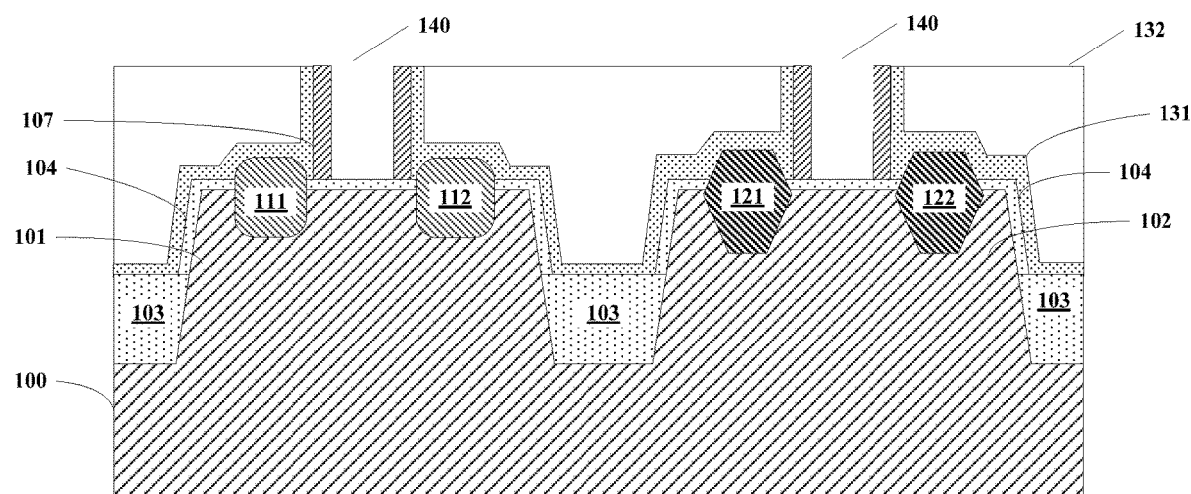

Referring to FIG. 5, the two dummy gate electrodes 105 are removed to form two trenches 140. That is, the two trenches 140 are formed on the first fin structure 101 and the second fin structure 102, respectively.

Figure 6A:
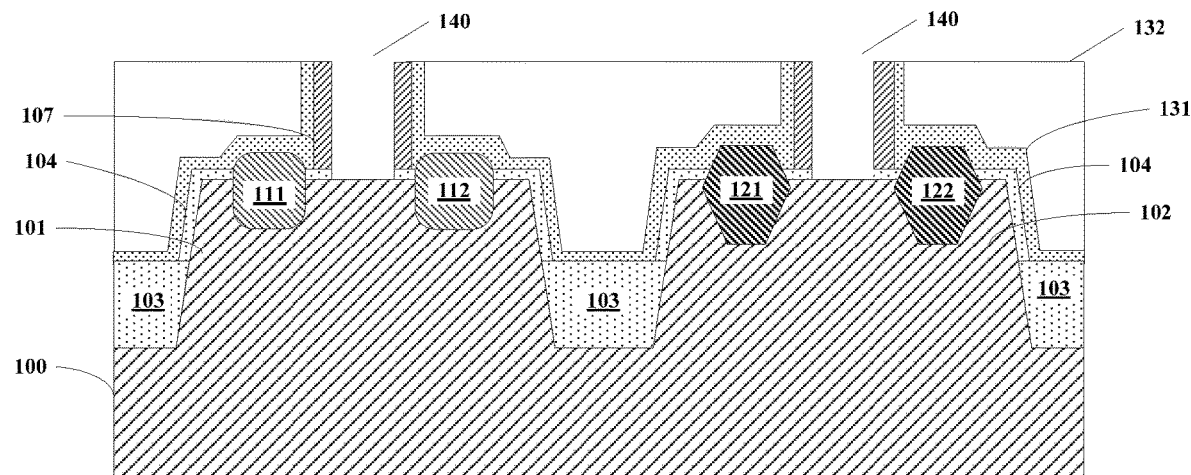
Figure 6B:
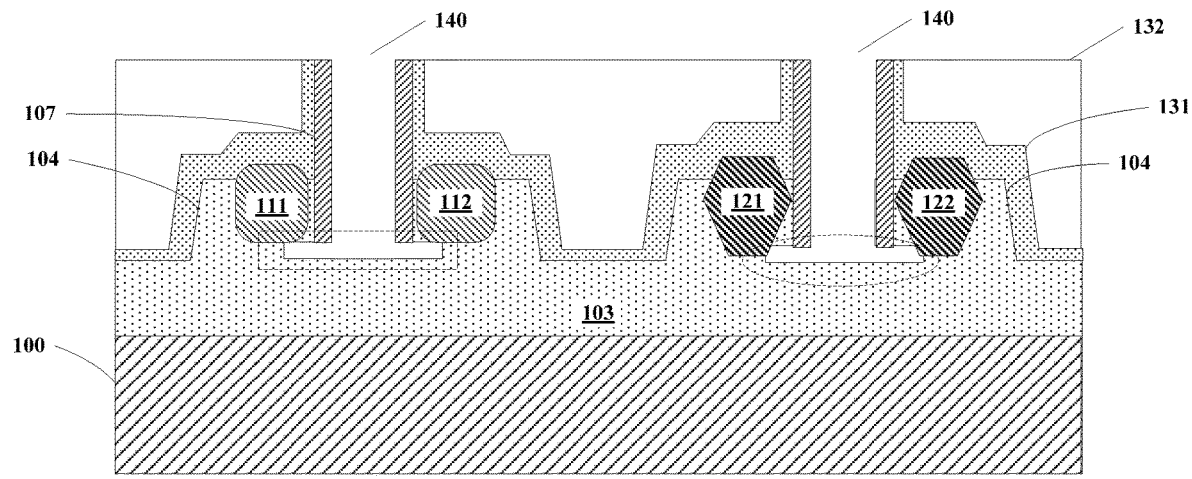
Figure 6C:
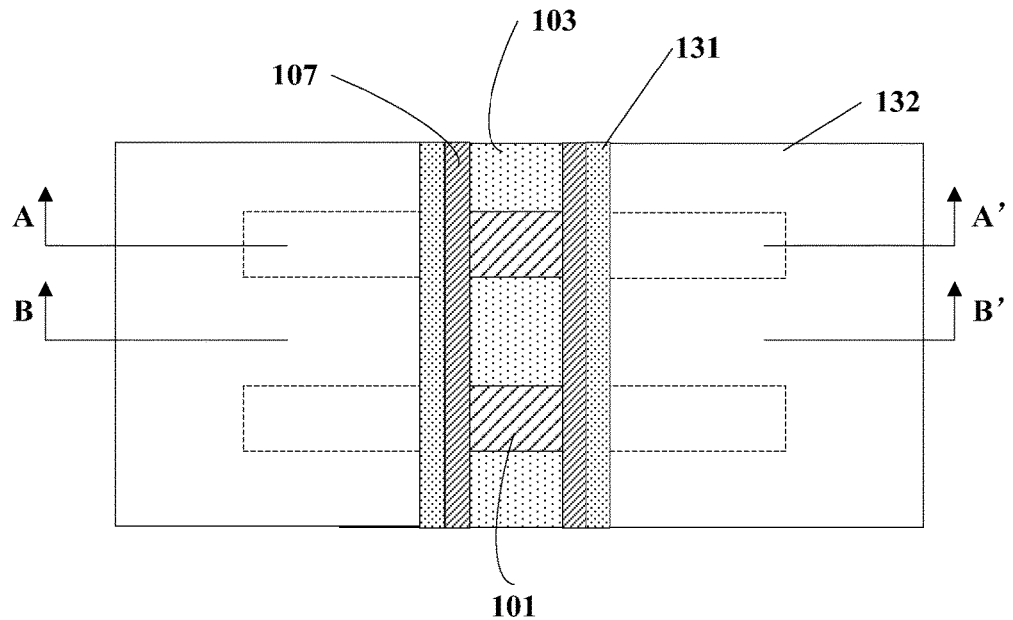

Referring to FIG. 6A, FIG. 6B, and FIG. 6C, an etching process is performed to remove the portion of the dummy insulating layer 104 formed in each trench 140. FIG. 6C illustrates a schematic top view of the semiconductor structure after removing the portion of the dummy insulating layer formed in each trench. FIG. 6A illustrates a schematic cross-section view of the structure shown in FIG. 6C along the A-A' direction, and FIG. 6B illustrates a schematic cross-section view of the structure shown in FIG. 6C along the B-B' direction. After removing the portion of the dummy insulating layer 104 formed in each trench 140, a portion of the top surface of the first fin structure 101 as well as a portion of the top surface of the second fin structure 102 are exposed.

Referring to FIG. 6B, during the etching process to remove the portion of the dummy insulating layer in each trench 140, the etching process may result in lateral etching of the silicon oxide layer 103 in the trench 140. The lateral etching of the silicon oxide layer 103 may form gaps in the silicon oxide layer 103. For example, the gaps formed in the silicon oxide layer 103 may be close to the channels, and thus the source electrode and the drain electrode on the two opposite sides of each trench 140 may be exposed by the gaps. As shown in FIG. 6B, a square box indicates exposing of the first source electrode 111 and the first drain electrode 112 by a gap formed in the silicon oxide layer 103, and a circle indicates exposing of the second source electrode 121 and the second drain electrode 122 by a gap formed in the silicon oxide layer 103.

Further, when a metal gate electrode is formed in each trench 140, the metal gate electrode may be connected to the source electrode and the drain electrode through the gaps formed in the silicon oxide layer 103. As such, the reliability of the formed device may be degraded.

Figure 7:
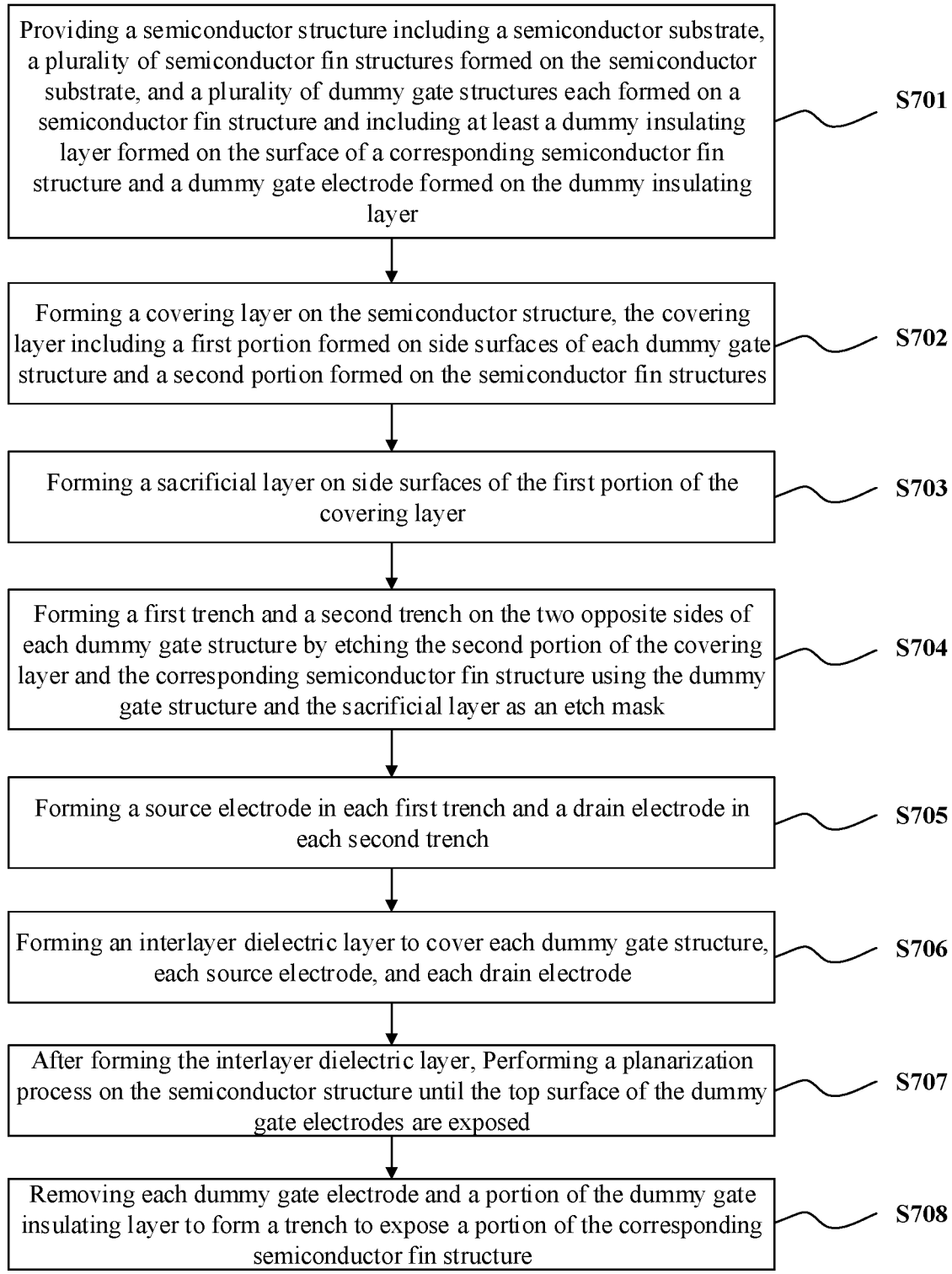
FIG. 7 illustrates a flowchart of an exemplary method for fabricating a semiconductor device consistent with various embodiments of the present disclosure.

The present disclosure provides a method for fabricating semiconductor devices. FIG. 7 illustrates a flowchart of an exemplary method for fabricating a semiconductor device consistent with various embodiments of the present disclosure. FIG. 8, FIG. 9A, FIG. 9B, and FIGS. 10-21 illustrate schematic views of semiconductor structures at certain stages of the exemplary fabrication process.

Referring to FIG. 7, in Step S701, a semiconductor structure may be provided.

The semiconductor structure may include a semiconductor substrate, a plurality of semiconductor fin structures formed on the semiconductor substrate, and a plurality of dummy gate structure formed on the plurality of semiconductor fin structures. Each dummy gate structure may be formed on a semiconductor fin structure and may include at least a dummy insulating layer formed on the surface of the corresponding semiconductor fin structure and a dummy gate electrode formed on the dummy insulating layer. FIG. 8, FIG. 9A, FIG. 9B, and FIG. 10 illustrate schematic views of semiconductor structures at certain stages of the fabrication process.

Figure 8:
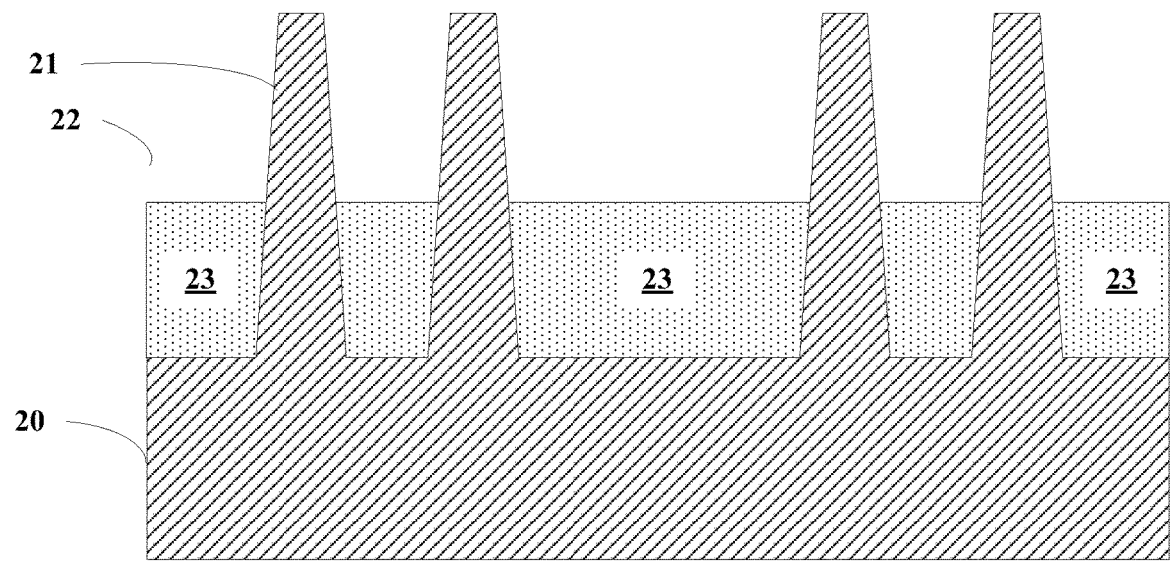
FIG. 8, FIG. 9A, FIG. 9B, and FIGS. 10-21 illustrate schematic views of semiconductor structures at certain stages of an exemplary method for fabricating a semiconductor structure consistent with various embodiments of the present disclosure.

Referring to FIG. 8, an initial structure may be provided. The initial structure may include a semiconductor substrate 20 and a plurality of semiconductor fin structures 21 formed on the semiconductor substrate 20. The semiconductor substrate 20 and the plurality of semiconductor fin structures 21 may be formed by a same material including silicon. Referring to FIG. 8, the initial structure includes a plurality of semiconductor fin structures 21 formed on the semiconductor substrate 20. Moreover, the initial structure may also include a plurality of trenches 22 surrounding each semiconductor fin structure 21, and a trench insulation layer 23 partially filling the plurality of trenches 22. In one embodiment, the trench insulation layer 23 may be made of a material including $SiO_2$.

Figure 9A:
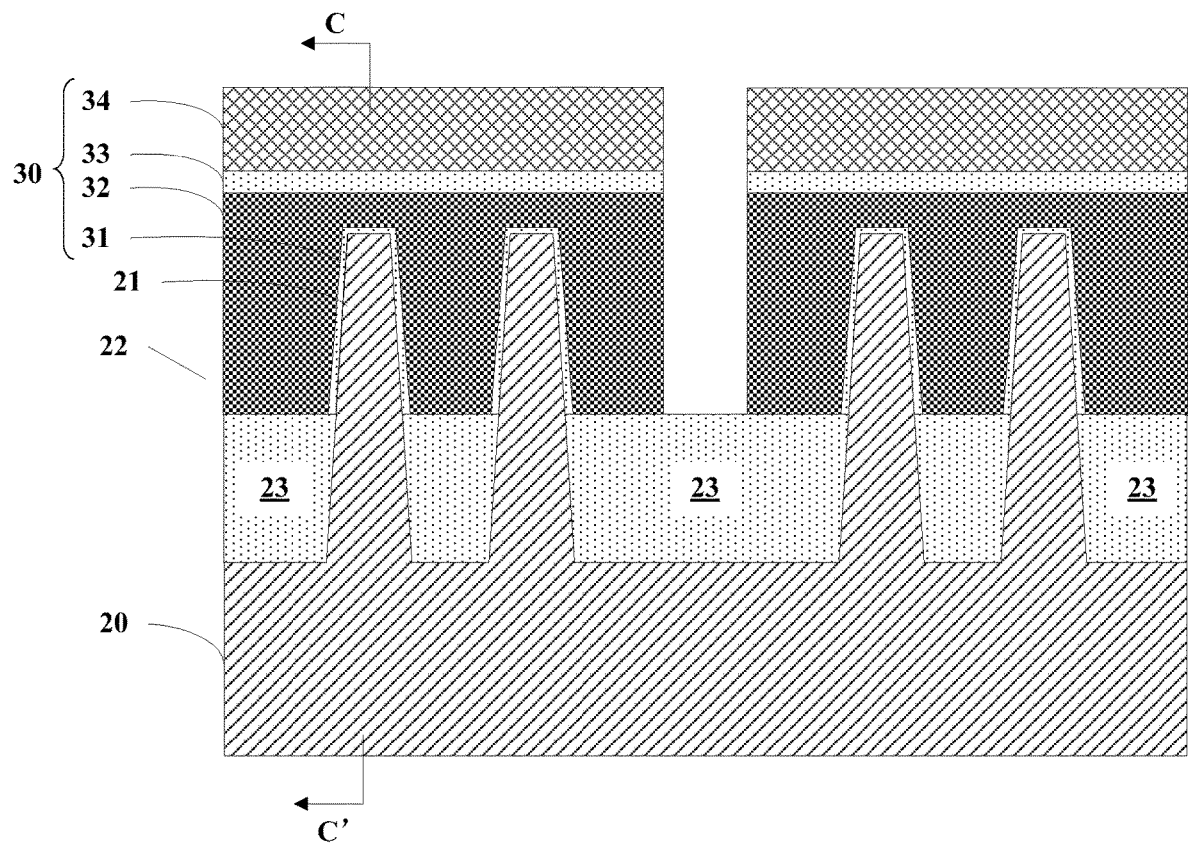
Figure 9B:
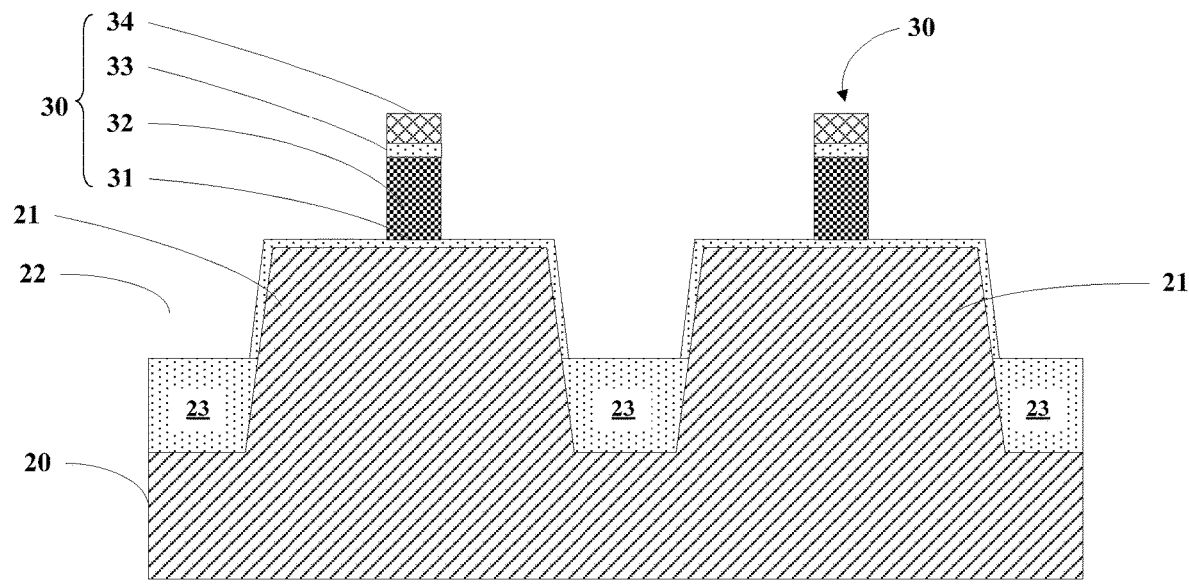

Further, referring to FIG. 9A and FIG. 9B, a dummy gate structure may be formed on each semiconductor fin structure. FIG. 9A shows a schematic cross-section view of a corresponding semiconductor structure along a direction perpendicular to the extending direction of the semiconductor fin structures. FIG. 9B shows a schematic cross-section view of the semiconductor structure shown in FIG. 9A along a C-C' direction. That is, FIG. 9B shows the schematic cross-section view of the semiconductor structure along the extending direction of a semiconductor fin structure.

The dummy gate structure 30 on each semiconductor fin structure 21 may include a dummy insulating layer (e.g. $SiO_2$) 31 formed on the surface of the corresponding semiconductor fin structure 21 and a dummy gate electrode 32 formed on the dummy insulating layer 31. In one embodiment, the dummy gate electrode 32 may be made of a material including polycrystalline silicon. In addition, the dummy gate structure 30 may also include a hard mask layer 34 formed on the dummy gate electrode 32. In one embodiment, the hard mask layer 34 may include a silicon nitride layer formed on the dummy gate electrode and a silicon oxide layer formed on the silicon nitride layer. Moreover, the dummy gate structure 30 may further include a buffer layer (e.g. a $SiO_2$ layer) 33 formed between the dummy gate electrode 32 and the hard mask layer 34.

Figure 10:
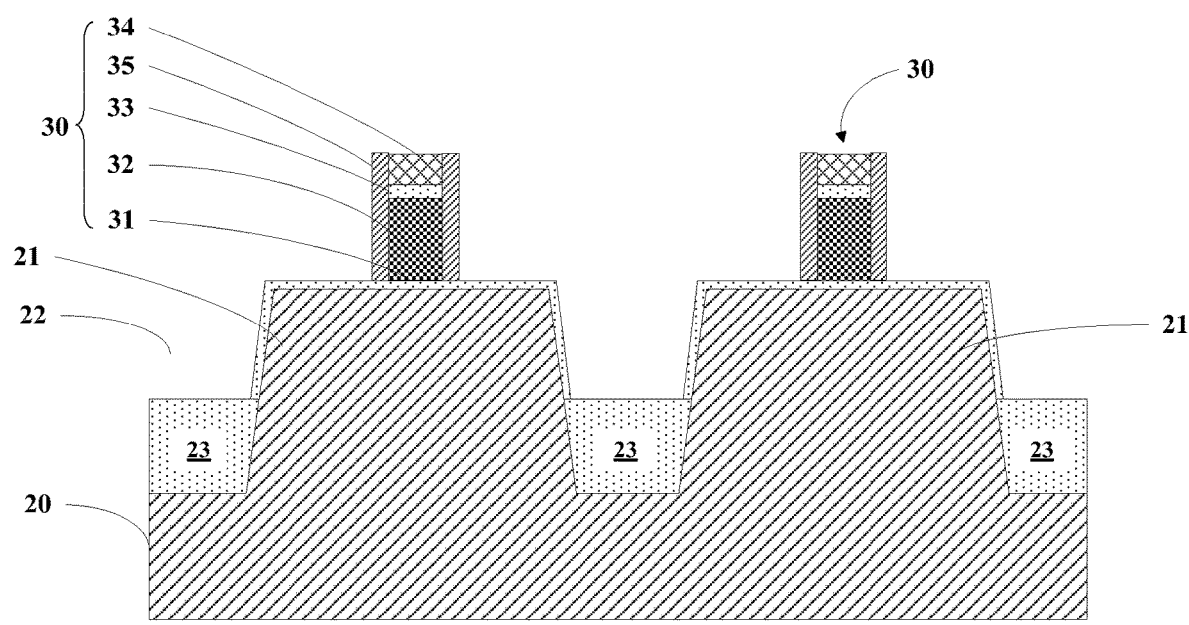

Further, referring to FIG. 10, a sidewall spacing layer 35 may be formed on the side surfaces of the dummy gate electrode 32 and the hard mask layer 34. In one embodiment, the sidewall spacing layer 35 may be made of a material including $SiO_2$ and/or $SiN_x$. In other embodiments, the sidewall spacing layer 35 may be made of other appropriate material. Moreover, after forming the sidewall spacing layer, the fabrication process may also include performing an ion implantation process to form lightly doped drains (LDDs).

As such, the semiconductor structure shown in FIG. 10 may be provided. The semiconductor structure may include a semiconductor substrate 20, a plurality of semiconductor fin structures 21 formed on the semiconductor substrate 20, and a plurality of dummy gate structures 30. Each dummy gate structure 30 may be formed on a semiconductor fin structure 21 and may include a dummy insulating layer 31 formed on the surface of the corresponding semiconductor fin structure 21 and a dummy gate electrode 32 formed on the dummy insulating layer 31. For illustration purpose, FIG. 10 shows two identical or similar dummy gate structures 30 formed on two semiconductor fin structures 21, respectively.

Referring to FIG. 10, the dummy gate structure 30 may also include a hard mask layer 34 formed on the dummy gate electrode 32 and a sidewall spacing layer 35 formed on the side surfaces of the dummy gate electrode 32 and the hard mask layer 34. In addition, the dummy gate structure 30 may further include a buffer layer 33 formed between the dummy gate electrode 32 and the hard mask layer 34.

In one embodiment, the semiconductor structure may also include a plurality of trenches 22 formed on the semiconductor substrate 20 to surround the semiconductor fin structures 21 and a trench insulation layer 23 partially filling the plurality of trenches 22.

Figure 11:
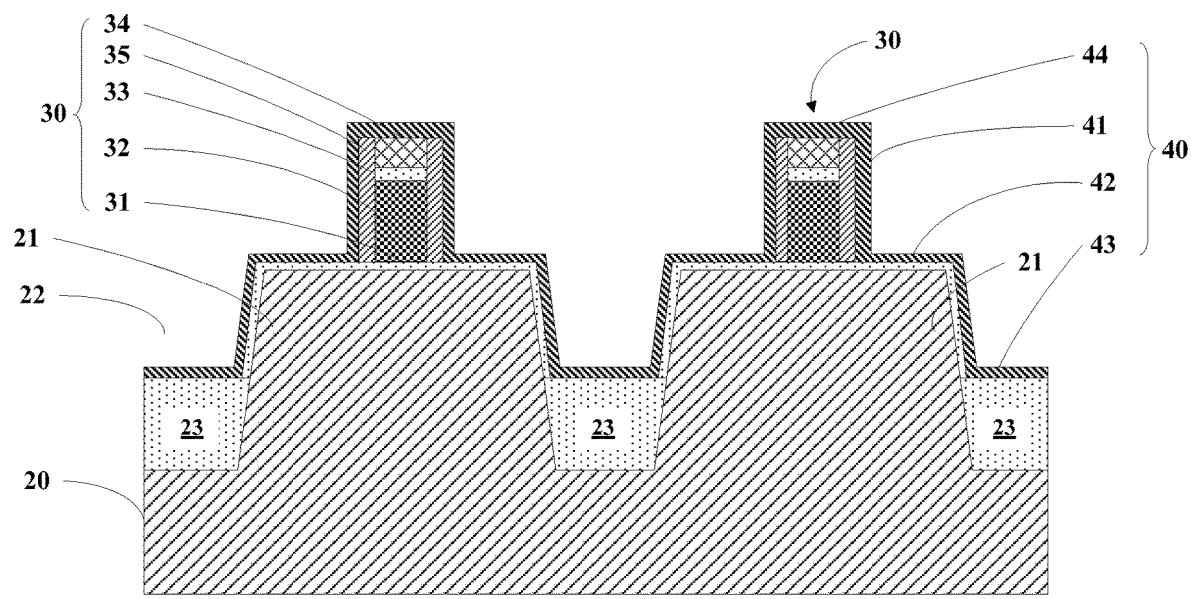

Returning to FIG. 7, in Step S702, a covering layer may be formed on the semiconductor structure. FIG. 11 shows a schematic cross-section view of a corresponding semiconductor structure formed in Step S702.

Referring to FIG. 11, a covering layer 40 may be formed on the semiconductor structure shown in FIG. 10. The covering layer 40 may include a first portion 41 of the covering layer 40 formed on the two side surfaces of each dummy gate structures 30 and a second portion 42 of the covering layer 40 formed on the semiconductor fin structures 21. In one embodiment, the first portion 41 of the covering layer 40 may be formed on the side surfaces of the sidewall spacing layer 35, the second portion 42 of the covering layer 40 may be formed on the surface of the dummy insulating layer 31 on each semiconductor fin structure 21. Moreover, the covering layer may also include a third portion 43 of the covering layer 40 covering the trench insulation layer 23 and a fourth portion 44 of the covering layer 40 formed on the top surface of each dummy gate structure 30. For example, the fourth portion 44 of the covering layer 40 may be formed on the top surface of the hard mask layer 34.

In one embodiment, the covering layer 40 may be made of a material including one or more silicon nitrides. For example, the silicon nitrides may include SiN, SiCN, SiBCN, SiOCN, etc.

In one embodiment, the thickness of the covering layer 40 may be in a range of approximately 80 Å to 140 Å. For example, the thickness of the covering layer 40 may be 100 Å or 120 Å.

Figure 12:
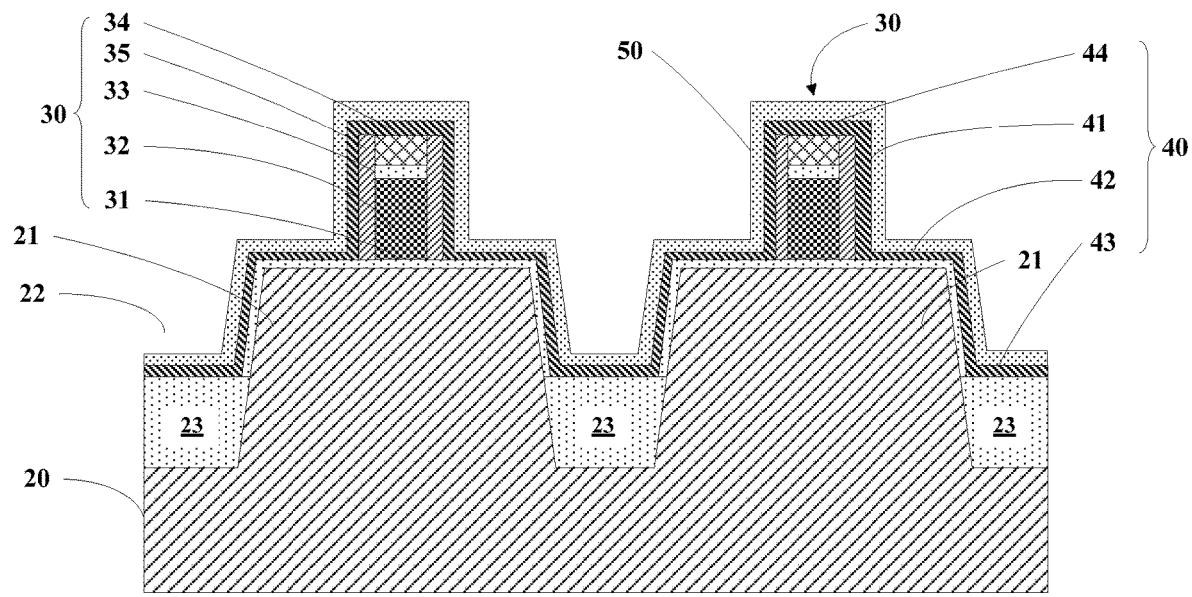
Figure 13:
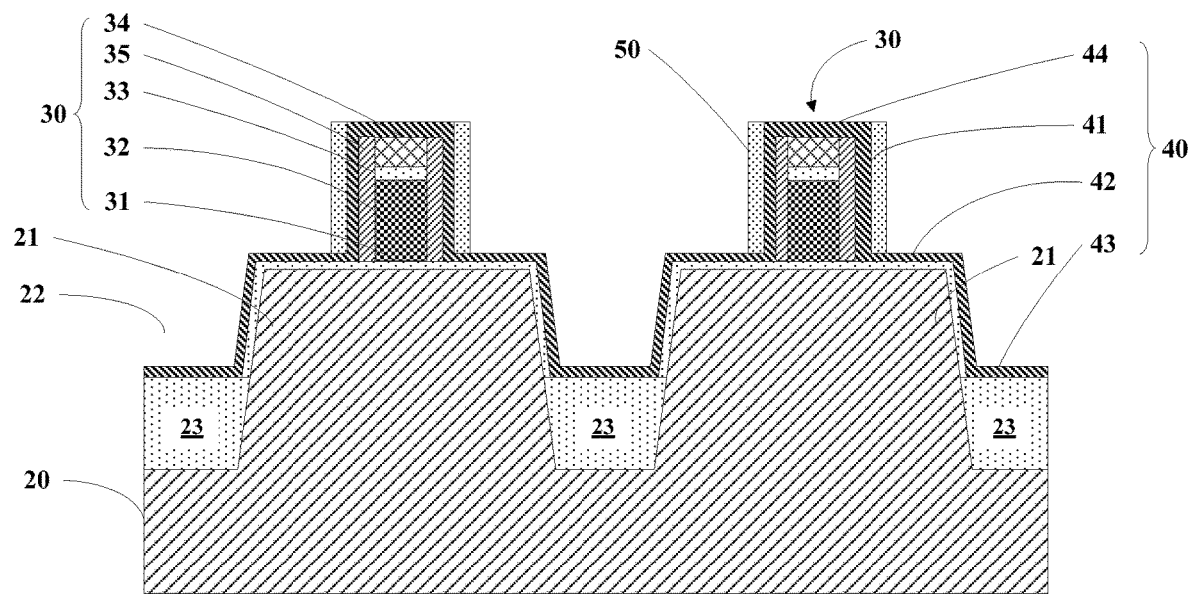

Further, returning to FIG. 7, in Step S703, a sacrificial layer may be formed on the first portion of the covering layer. FIG. 12 and FIG. 13 shows schematic cross-section views of semiconductor structures at different stages of the process to fabricate the sacrificial layer.

Referring to FIG. 12, Step S703 may include forming a sacrificial film on the covering layer 40. In one embodiment, the sacrificial film may be made of a material including silicon oxides (e.g. $SiO_2$). The thickness of the sacrificial film may be in a range of approximately 20 Å to 60 Å. For example, the thickness of the sacrificial film may be 30 Å, 40 Å, or 50 Å.

Referring to FIG. 13, Step S703 may further include performing an etching process on the sacrificial film. After the etching process, only the portion of the sacrificial film formed on the first portion 41 of the covering layer 40 may be retained to form the sacrificial layer 50 and the other portions of the sacrificial film may be removed. That is, the etching process may remove the portion of the sacrificial film formed on the second portion 42, the third portion 43, and the fourth portion 44 of the covering layer 40, and thus the remaining portion of the sacrificial film formed on the first-potion 41 of the covering layer 40 may become the sacrificial layer 50.

Figure 14:
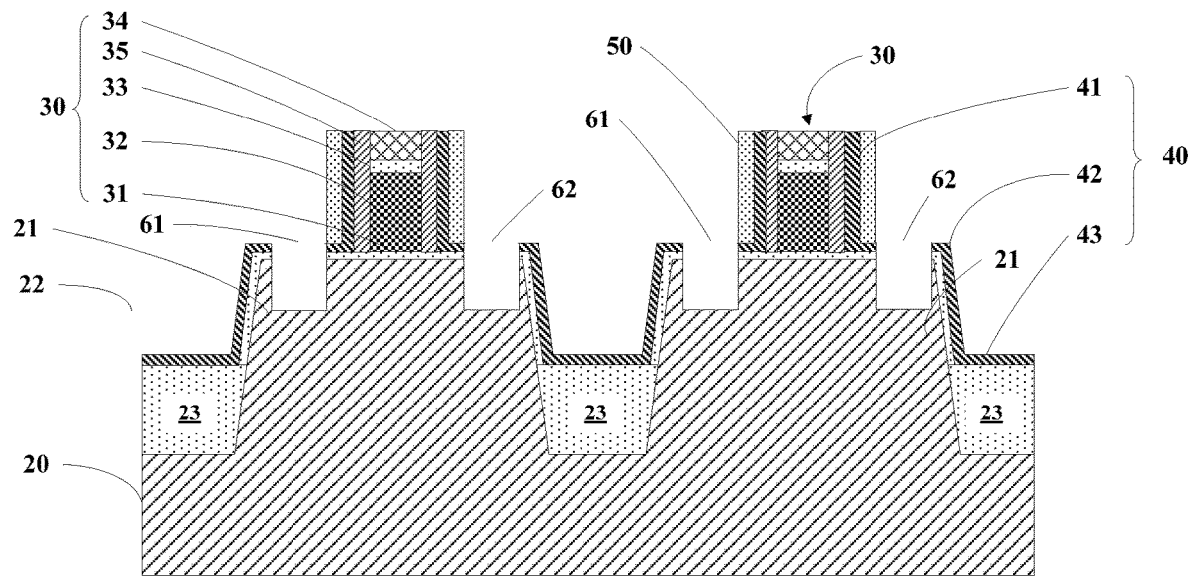

Returning to FIG. 7, further, in Step S704, an etching process using the dummy gate structure and the sacrificial layer as an etch mask may be performed on the second portion of the covering layer and the semiconductor fin structures to form a first trench and a second trench on the two opposite sides of each dummy gate structure. FIG. 14 shows a schematic cross-section view of a corresponding semiconductor structure.

Referring to FIG. 14, a self-aligned etching process using the dummy gate structure 30 and the sacrificial layer 50 as an etch mask may be performed on the second portion 42 of the covering layer 40 and the semiconductor fin structures 21 to form a first trench 61 and a second trench 62 on the two opposite sides of each dummy gate structure 30. During the etching process, a portion of the dummy insulating layer 31 formed on the surface of the semiconductor fin structures 21 may be removed first through etching to allow further etching the portion of the semiconductor fin structure 21 under the dummy insulating layer 31 and thus form the two trenches.

In one embodiment, referring to FIG. 14, the fourth portion 44 of the covering layer 40 may also be removed during the process to etch the second portion 42 of the covering layer 40 and the semiconductor fin structures 21.

Figure 15:
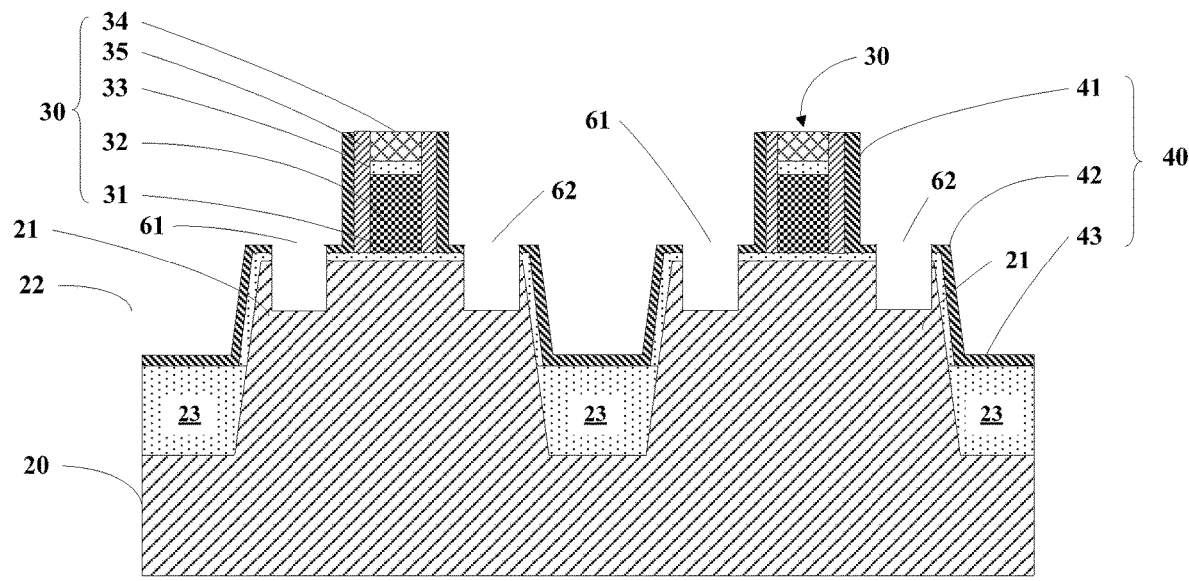

Further, referring to FIG. 15, after forming the first trench 61 and the second trench 62, the sacrificial layer 50 may be removed. As such, during a subsequent epitaxial process to form the source electrode and the drain electrode, the volumes of the source electrode and the drain electrode may be relatively large, which may increase the stress from the source region and the drain region to the channel. Therefore, the performance of the formed device may be improved.

Figure 16:
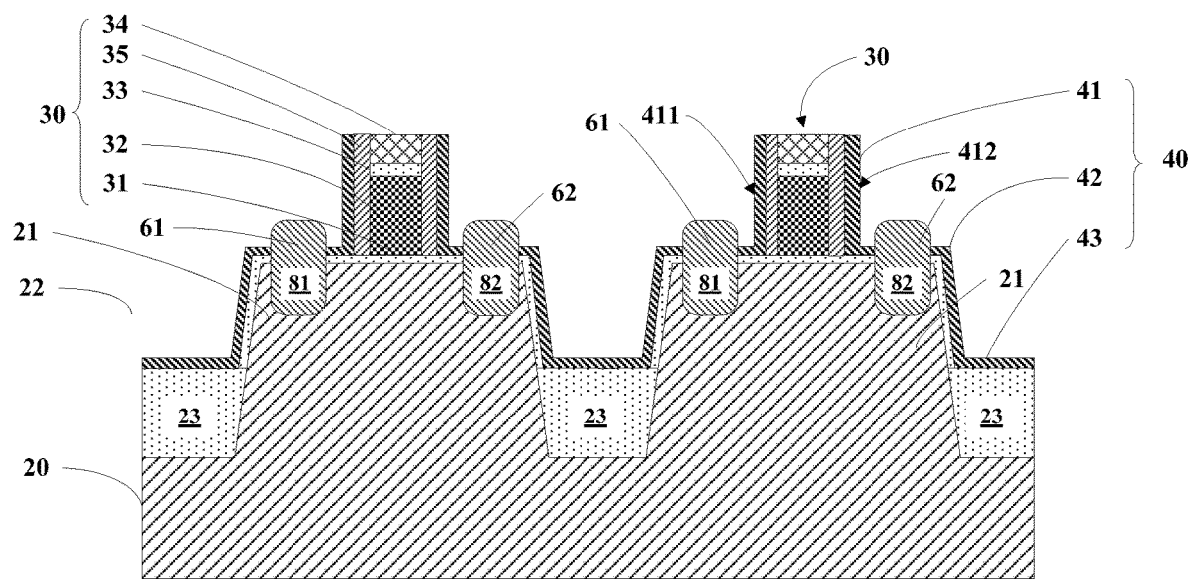

Returning to FIG. 7, in Step S705, a source electrode may be formed in the first trench and a drain electrode may be formed in the second trench. FIG. 16 shows a schematic cross-section view of a corresponding semiconductor structure.

Referring to FIG. 16, in one embodiment, by performing an epitaxial growth process, a source electrode 81 may be formed in the first trench 61 and a drain electrode 82 may be formed in the second trench 62. Further, the first portion 41 of the covering layer 40 may include a source-side portion 411 between the source electrode 81 and the dummy gate structure 30 and a drain-side portion 412 between the drain electrode 82 and the dummy gate structure 30. Because the sacrificial layer 50 (referring to FIG. 14) is removed, a gap may be formed between the source-side portion 411 and the source region 81, and another gap may be formed between the drain-side portion 412 and the source region 81.

Figure 17:
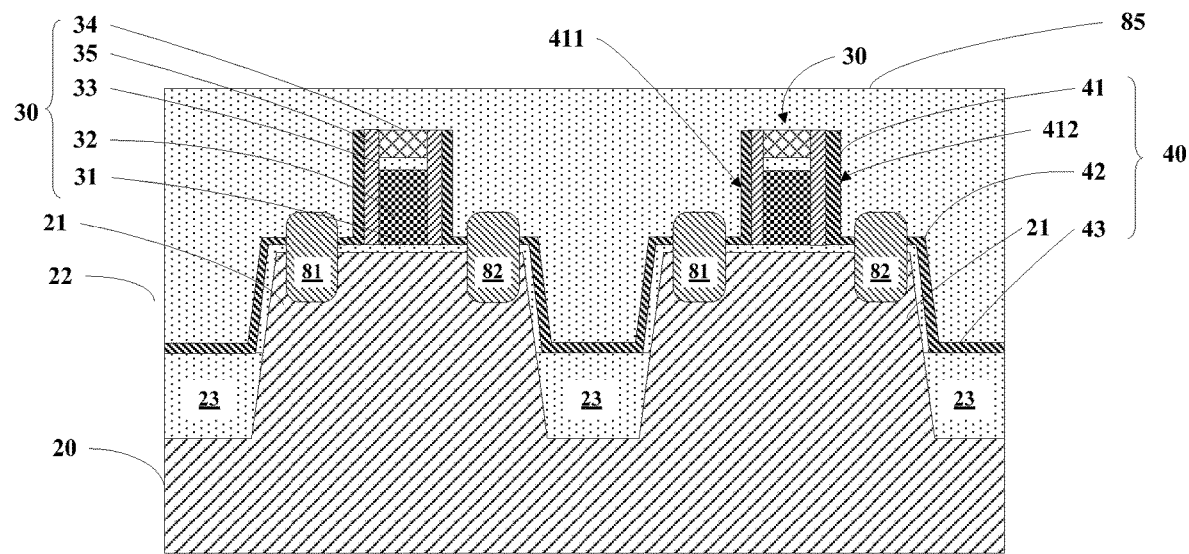

Further, returning to FIG. 7, in Step S706, an interlayer dielectric layer may be formed to cover the dummy gate structures, the source electrodes, and the drain electrodes. FIG. 17 shows a schematic cross-section view of a corresponding semiconductor structure.

Referring to FIG. 17, an interlayer dielectric layer 85 may be formed on the semiconductor structure shown in FIG. 16. The interlayer dielectric layer 85 may cover the dummy gate structures 30, the source electrodes 81, and the drain electrodes 82. The interlayer dielectric layer may be made of a material including $SiO_2$.

In one embodiment, during the formation of the interlayer dielectric layer 85, a portion of the interlayer dielectric layer 85 may separate each source electrode 81 from the corresponding source-side portion 411 of the covering layer 40, and another portion of the interlayer dielectric layer 85 may separate each drain electrode 82 from the corresponding drain-side portion 412 of the covering layer 40. That is, the interlayer dielectric layer 85 may fill the gap between the source-side portion 411 of the covering layer 40 and the source electrode 81 and the gap between the drain-side portion 412 of the covering layer 40 and the drain electrode 82.

Figure 18:
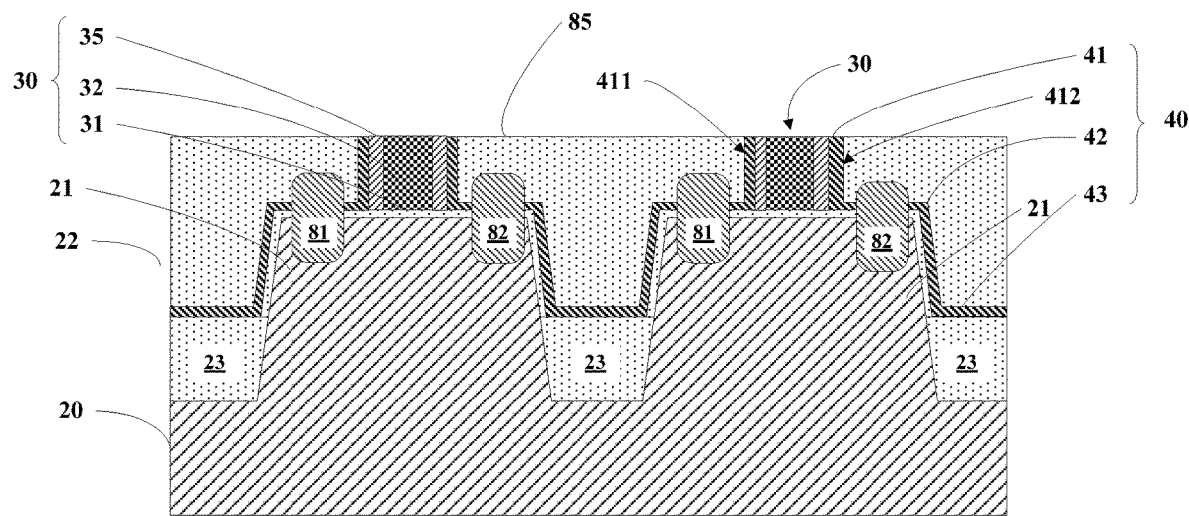

Further, returning to FIG. 7, in Step S707, after forming the interlayer dielectric layer, a planarization process may be performed on the semiconductor structure until the top surfaces of the dummy gate electrodes are exposed. FIG. 18 shows a schematic cross-section view of a corresponding semiconductor structure.

Referring to FIG. 18, after forming the interlayer dielectric layer, a planarization process (e.g. a CMP process) may be performed on the semiconductor structure (referring to FIG. 17) to expose the top surface of each dummy gate electrode 32. In one embodiment, during the planarization process, the buffer layer 33 (referring to FIG. 17) may also be removed.

The planarization process may include a first planarization process and a second planarization process. For example, a portion of the interlayer dielectric layer 85 together with the hard mask layer 34 may be removed by the first planarization process, and then another portion of the interlayer dielectric layer 85 together with the buffer layer 33 may be removed by the second planarization process. As such, the top surfaces of the dummy gate electrodes 32 may be exposed.

Figure 19:
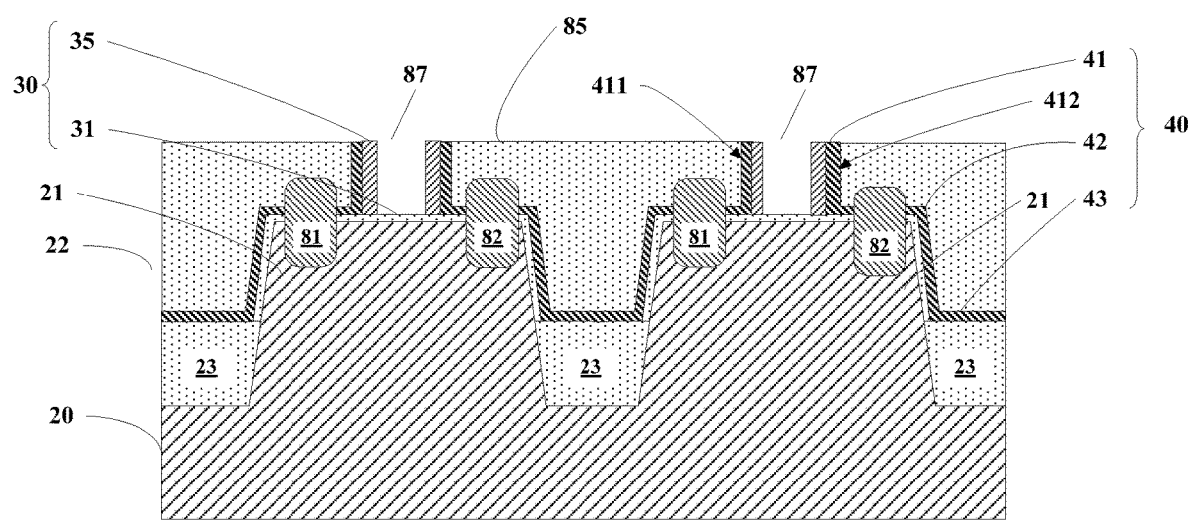
Figure 20:
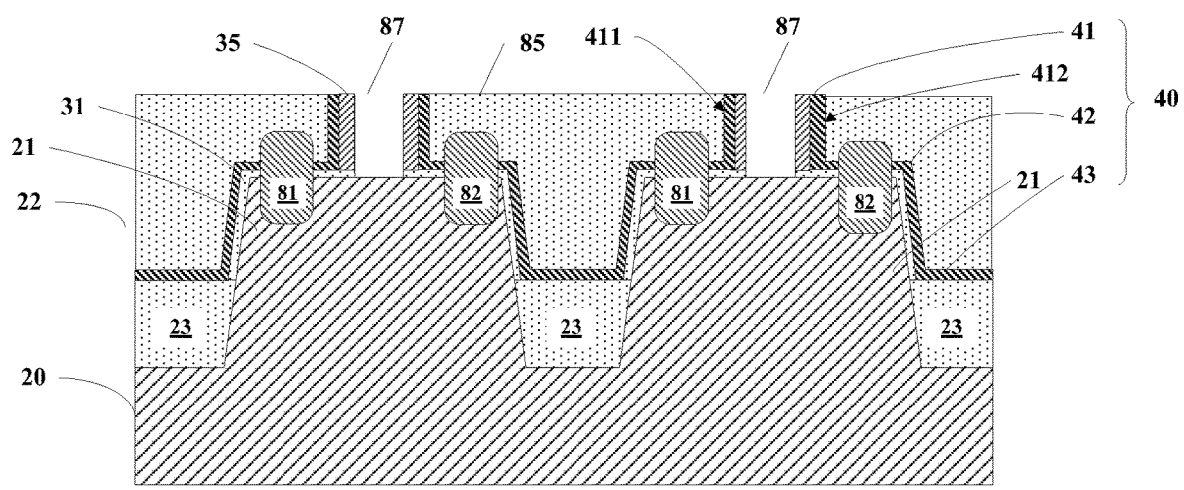

Returning to FIG. 7, in Step S708, each dummy gate electrode and a portion of the dummy insulating layer may be removed to form a trench exposing a portion of the corresponding semiconductor fin structure. FIG. 19 and FIG. 20 show schematic cross-section views of semiconductor structures at certain stages of the fabrication process.

Referring to FIG. 19, after performing the planarization process to expose the top surface of each dummy gate electrode, Step S708 may include removing the dummy gate electrode 32 to form a trench 87. A portion of the dummy insulating layer 31 may be exposed on the bottom of the trench 87.

Further, referring to FIG. 20, Step S708 may also include removing a portion of the dummy insulating layer 31 to expose a portion of the surface of the corresponding semiconductor fin structure 21. As such, in Step S708, a trench 87 exposing a portion of the surface of the semiconductor fin structure 21 may be formed.

Therefore, according to the disclosed methods for fabricating semiconductor devices, prior to forming the source electrode and the drain electrode, a covering layer is formed on the semiconductor structure and then a sacrificial layer is formed on the covering layer on the two opposite sides of each dummy gate structure. Further, using the sacrificial layer and the dummy gate structure as an etch mask, an etching process is performed on the covering layer and the semiconductor fin structures to form a first trench and a second trench on the two opposite sides of each dummy gate structure. Moreover, a source electrode and a drain electrode are then formed in the first trench and the second trench, respectively. After forming an interlayer dielectric layer on the semiconductor structure, a planarization process is performed until the top surfaces of the dummy gat structures are exposed. Further, each dummy gate electrode and a portion of the dummy insulating layer are removed to form a trench exposing a portion of the surface of the corresponding semiconductor fin structure.

As compared to similar parts or components in semiconductor devices fabricated by conventional process, the covering layer and the sacrificial layer formed by the disclosed fabrication process may ensure that the source electrode and the drain electrode are sufficiently far away from the dummy gate structure such that the source electrode and the drain electrode are also sufficiently far away from the trench formed by removing the dummy gate electrode and the dummy insulating layer in a subsequent process. Therefore, during the process to form the trench by removing the dummy gate electrode and the portion of the dummy insulating layer, even the trench insulation layer is still etched along lateral directions similar to that in conventional fabrication process, the lateral etching effect may unlikely lead to exposure of the source electrode and the drain electrode. Therefore, in a subsequent process to form a metal gate electrode, the formed metal electrode may not be connected to the source electrode and/or the drain electrode. As such, the reliability of the formed device may be improved.

Further, because the distance from the source electrode or the drain electrode to the metal gate electrode in the disclosed semiconductor devices is larger than the distance from the source electrode or the drain electrode to the metal gate electrode in semiconductor devices fabricated by conventional methods, the volumes of the source electrode and the drain electrode may be allowed to be formed larger. As such, the stress from the source electrode and the drain electrode to the channel may be improved, and the performance of the formed device may be improved.

Figure 21:
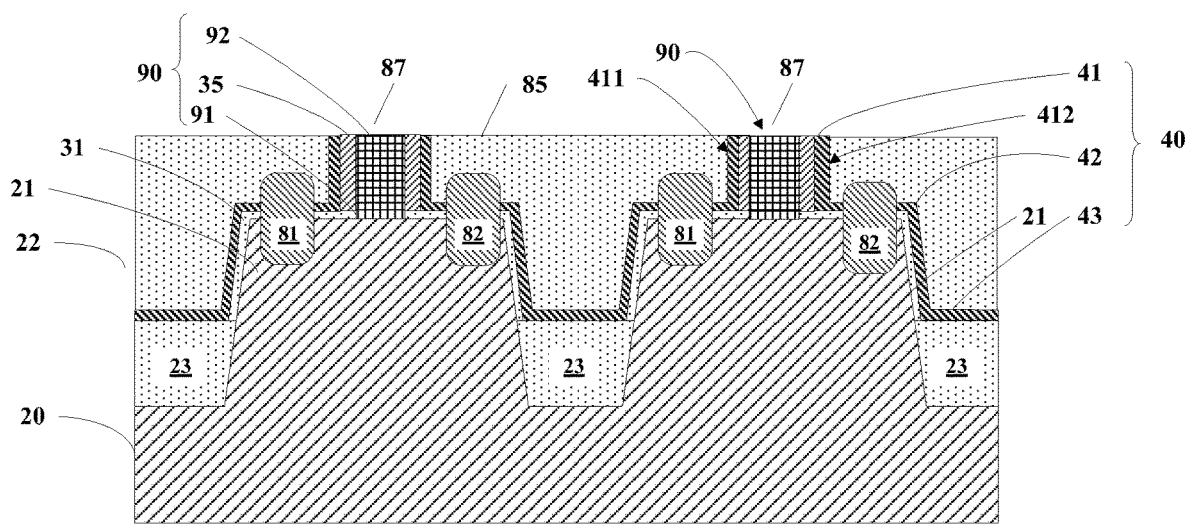

In one embodiment, referring to FIG. 21, after forming the plurality of trenches 87, the fabrication method may also include forming a gate structure 90 in each trench 87. The gate structure 90 may include a gate dielectric layer 91 formed in the trench 87 and covering a portion of the surface of the semiconductor fin structure 21, and a metal gate electrode 92 formed on the gate dielectric layer 91.

The gate dielectric layer 91 may be made of a material including one or more of $SiO_2$, high-k dielectric materials (such as $TiO_2$, $HfO_2$, etc.), and any other appropriate dielectric material. The metal gate electrode 92 may be made of a material including W and/or any other appropriate metal electrode material.

As compared to conventional fabrication process, the disclosed fabrication process ensures that the source electrode and the drain electrode are sufficiently far away from the dummy gate structure. Therefore, during the process to form the trench by removing the dummy gate electrode and the portion of the dummy insulating layer, even the trench insulation layer is still etched along lateral directions similar to that in conventional fabrication process, the lateral etching effect may unlikely lead to exposure of the source electrode and the drain electrode. Therefore, in a subsequent process to form a metal gate electrode, the formed metal electrode may not be connected to the source electrode and/or the drain electrode. As such, the reliability of the formed device may be improved.

The present disclosure also provides a semiconductor device. FIG. 21 illustrates a schematic cross-section view of an exemplary semiconductor device consistent with various embodiments of the present disclosure.

Referring to FIG. 21, the semiconductor device may include a semiconductor substrate 20, a plurality of semiconductor fin structures 21 formed on the semiconductor substrate 20, and a plurality of gate structures 90. Each gate structure 90 may be formed on a semiconductor fin structure 21. The semiconductor device may also include a source electrode 81 and a drain electrode 82 formed on the two opposite sides of each gate structure 90. Moreover, at least a portion of the source electrode 81 and at least a portion of the drain electrode 82 may be formed in the semiconductor fin structure 21. The semiconductor device may further include a covering layer 40 formed on each semiconductor fin structure 21 and also on the two side surfaces of the gate structure 90. The covering layer may include a first portion 41 formed on the two side surfaces of the gate structure 90 and a second portion 42 formed on the semiconductor fin structure 21. The semiconductor device may also include an interlayer dielectric layer 85 formed on the covering layer 40. The interlayer dielectric layer 85 may cover the source electrode 81 and the drain electrode 82 formed on the two opposite sides of each semiconductor fin structure 21. Moreover, each gate structure 90 may be formed in a trench 87 opened in the interlayer dielectric layer 85. The bottom of the trench 87 may expose a portion of the surface of the corresponding semiconductor fin structure 21.

Further, referring to FIG. 21, each gate structure 90 may include a gate dielectric layer 91 formed in the trench 87 and covering a portion of the surface of the corresponding semiconductor fin structure 21, and a metal gate electrode 92 formed on the gate dielectric layer 91. In one embodiment, the gate structure 90 may also include a sidewall spacing layer 35 formed in the trench 87 and on the side surfaces of each metal gate electrode 92. Further, the first portion 41 of the covering layer may be formed on the side surfaces of the sidewall spacing layer 35.

In one embodiment, the covering layer may be made of a material including one or more silicon nitrides. For example, the silicon nitrides may include SiN, SiCN, SiBCN, SiOCN, etc. Moreover, the thickness of the covering layer 40 may be in a range of approximately 80 Å to 140 Å. For example, the thickness of the covering layer 40 may be 100 Å or 120 Å.

In one embodiment, the first portion 41 of the covering layer 40 may include a source-side portion 411 between the source electrode 81 and the gate structure 90 and a drain-side portion 412 between the drain electrode 82 and the gate structure 90.

In one embodiment, a portion of the interlayer dielectric layer 85 may separate each source electrode 81 from the corresponding source-side portion 411 of the covering layer 40, and another portion of the interlayer dielectric layer 85 may separate each drain electrode 82 from the corresponding drain-side portion 412 of the covering layer 40.

In one embodiment, the distance from a source electrode 81 to the corresponding source-side portion 411 of the covering layer 40 may be in a range of approximately 20 Å to 60 Å. For example, the distance from the source electrode 81 to the source-side portion 411 of the covering layer 40 may be 30 Å, 40 Å, or 50 Å. In addition, the distance from a drain electrode 82 to the corresponding drain-side portion 412 of the covering layer 40 may be in a range of approximately 20 Å to 60 Å. For example, the distance from the drain electrode 82 to the drain-side portion 412 of the covering layer 40 may be 30 Å, 40 Å, or 50 Å.

In another embodiment, the semiconductor device may include a sacrificial layer formed on the side surface of the first portion of the covering layer. A portion of the sacrificial layer may separate each source electrode from the corresponding source-side portion of the covering layer, and another portion of the sacrificial layer may separate each drain electrode from the corresponding drain-side portion of the covering layer. The sacrificial layer is not shown in FIG. 21. However, during the fabrication process, when the sacrificial layer 50 (referring to FIG. 14) is not removed, the subsequently-formed semiconductor device may include the sacrificial layer 50. In one embodiment, the semiconductor device may include a sacrificial layer formed on the side surface of the first portion of the covering layer. The sacrificial layer may be made of a material including silicon oxides. The thickness of the sacrificial layer may be in a range of approximately 20 Å to 60 Å. For example, the thickness of the sacrificial layer may be 30 Å, 40 Å, or 50 Å.

In one embodiment, referring to FIG. 21, the semiconductor device may also include a dummy insulating layer 31 formed on each semiconductor fin structure 21. Accordingly, the second portion 42 of the covering layer 40 may be formed on the dummy insulating layer 31.

As compared to conventional semiconductor devices, the disclosed semiconductor devices ensure that the source electrode and the drain electrode are sufficiently far away from the dummy gate structure. Therefore, the disclosed semiconductor devices may be able to prevent the metal electrode from being connected to the source electrode or to the drain electrode. As such, the reliability of the formed device may be improved.

Compared to existing semiconductor devices and fabrication methods, the disclosed semiconductor devices and fabrication methods may demonstrate several advantages.

According to the disclosed fabrication methods, prior to forming the source electrode and the drain electrode, a covering layer is formed on the semiconductor structure and then a sacrificial layer is formed on the covering layer on the two opposite sides of each dummy gate structure. Further, using the sacrificial layer and the dummy gate structure as an etch mask, an etching process is performed on the covering layer and the semiconductor fin structures to form a first trench and a second trench on the two opposite sides of each dummy gate structure. Moreover, a source electrode and a drain electrode are then formed in the first trench and the second trench, respectively. After forming an interlayer dielectric layer on the semiconductor structure, a planarization process is performed until the top surfaces of the dummy gat structures are exposed. Further, each dummy gate electrode and a portion of the dummy insulating layer are removed to form a trench exposing a portion of the surface of the corresponding semiconductor fin structure.

As compared to similar parts or components in semiconductor devices fabricated by conventional process, the covering layer and the sacrificial layer formed by the disclosed fabrication process may ensure that the source electrode and the drain electrode are sufficiently far away from the dummy gate structure such that the source electrode and the drain electrode are also sufficiently far away from the trench formed by removing the dummy gate electrode and the dummy insulating layer in a subsequent process. Therefore, during the process to form the trench by removing the dummy gate electrode and the portion of the dummy insulating layer, even the trench insulation layer is still etched along lateral directions similar to that in conventional fabrication process, the lateral etching effect may unlikely lead to exposure of the source electrode and the drain electrode. Therefore, in a subsequent process to form a metal gate electrode, the formed metal electrode may not be connected to the source electrode and/or the drain electrode. As such, the reliability of the formed device may be improved.

Further, because the distance from the source electrode or the drain electrode to the metal gate electrode in the disclosed semiconductor devices is larger than the distance from the source electrode or the drain electrode to the metal gate electrode in semiconductor devices fabricated by conventional methods, the volumes of the source electrode and the drain electrode may be allowed to be formed larger. As such, the stress from the source electrode and the drain electrode to the channel may be improved, and the performance of the formed device may be improved.

Further, as compared to conventional semiconductor devices, the disclosed semiconductor devices ensure that the source electrode and the drain electrode are sufficiently far away from the dummy gate structure. Therefore, the disclosed semiconductor devices may be able to prevent the metal electrode from being connected to the source electrode or to the drain electrode. As such, the reliability of the formed device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor device, comprising:
   a semiconductor substrate;
   a plurality of semiconductor fin structures formed on the semiconductor substrate;
   a plurality of gate structures, each formed on a semiconductor fin structure;
   a source electrode and a drain electrode formed on two opposite sides of each gate structure, wherein, at least a portion of the source electrode and at least a portion of the drain electrode are formed in the semiconductor fin structure;
   a covering layer formed on the semiconductor fin structures and also on two side surfaces of each gate structure, wherein
      the covering layer includes a first portion formed on the two side surfaces of each gate structure and a second portion formed on the plurality of semiconductor fin structures,
      a projection of the source electrode and the drain electrode and a projection of each of the plurality of gate structures on a corresponding semiconductor fin structure of the plurality of semiconductor fin structures are isolated by a projection of the covering layer on the corresponding semiconductor fin structure of the plurality of semiconductor fin structures, and
      the projection of the source electrode and the drain electrode has no overlap with the projection of the covering layer on the corresponding semiconductor fin structure of the plurality of semiconductor fin structures; and
   an interlayer dielectric layer formed on the covering layer, wherein
      the interlayer dielectric layer covers each source electrode and each drain electrode, a trench is formed in the interlayer dielectric layer to expose a portion of each semiconductor fin structure, and a gate structure is formed in each trench, and
      each of the source electrode and the drain electrode is formed between the first portion and the second portion of the covering layer, and has a top surface and side surfaces directly covered by the interlayer dielectric layer.

2. The semiconductor device according to claim 1, wherein:
   each gate structure includes a gate dielectric layer covering the portion of the semiconductor fin structure exposed in the trench and a metal gate electrode formed on the gate dielectric layer.

3. The semiconductor device according to claim 1, wherein:
   the covering layer is made of a material including one or more silicon nitrides; and
   a thickness of the covering layer is in a range of approximately 80 Å to 140 Å.

4. The semiconductor device according to claim 1, wherein:
   the first portion of the covering layer includes a source-side portion formed between the source electrode and the gate structure and a drain-side portion formed between the drain electrode and the gate structure.

5. The semiconductor device according to claim 4, wherein:
   a distance from the source electrode to the source-side portion of the covering layer is in a range of approximately 20 Å to 60 Å; and
   a distance from the drain electrode to the drain-side portion of the covering layer is in a range of approximately 20 Å to 60 Å.

6. The semiconductor device according to claim 4, further including:
   a sacrificial layer formed on side surfaces of the first portion of the covering layer, wherein, a portion of the sacrificial layer separates the source electrode from the source-side portion of the covering layer, and another portion of the sacrificial layer separates the drain electrode from the drain-side portion of the covering layer.

7. The semiconductor device according to claim 6, wherein:
   the sacrificial layer is made of a material including one or more silicon oxides; and
   a thickness of the covering layer is in a range of approximately 20 Å to 60 Å.

8. The semiconductor device according to claim 4, further including:

a plurality of trenches formed on the semiconductor substrate and surrounding each semiconductor fin structure; and a trench insulation layer partially filling the plurality of trenches.

9. The semiconductor device according to claim 8, wherein:

the covering layer also includes a third portion covering the trench insulation layer.

10. The semiconductor device according to claim 2, wherein:

each gate structure further includes a sidewall spacing layer formed on side surfaces of the metal gate electrode, wherein the first portion of the covering layer is formed on side surfaces of the sidewall spacing layer.

11. The semiconductor device according to claim 8, wherein:

the trench insulation layer is made of a material including $SiO_2$.

12. A semiconductor device, comprising:

a semiconductor substrate;

a plurality of semiconductor fin structures formed on the semiconductor substrate;

a plurality of gate structures, each formed on a semiconductor fin structure;

a source electrode and a drain electrode formed on two opposite sides of each gate structure, wherein, at least a portion of the source electrode and at least a portion of the drain electrode are formed in the semiconductor fin structure;

a covering layer formed on the semiconductor fin structures and also on two side surfaces of each gate structure, wherein the covering layer includes a first portion formed on the two side surfaces of each gate structure and a second portion formed on the plurality of semiconductor fin structures, a projection of the source electrode and the drain electrode has no overlap with a projection of the covering layer on the corresponding semiconductor fin structure of the plurality of semiconductor fin structures; and an interlayer dielectric layer formed on the covering layer, wherein the interlayer dielectric layer covers each source electrode and each drain electrode, a trench is formed in the interlayer dielectric layer to expose a portion of each semiconductor fin structure, and a gate structure is formed in each trench, wherein:

each of the source electrode and the drain electrode is formed between the first portion and the second portion of the covering layer, and has a top surface and side surfaces directly covered by the interlayer dielectric layer, the first portion of the covering layer includes a source-side portion formed between the source electrode and the gate structure and a drain-side portion formed between the drain electrode and the gate structure, and a portion of the interlayer dielectric layer separates the source electrode from the source-side portion of the covering layer, and another portion of the interlayer dielectric layer separates the drain electrode from the drain-side portion of the covering layer.

13. A semiconductor device, comprising:

a semiconductor substrate;

a plurality of semiconductor fin structures formed on the semiconductor substrate;

a plurality of gate structures, each formed on a semiconductor fin structure;

a source electrode and a drain electrode formed on two opposite sides of each gate structure, wherein, at least a portion of the source electrode and at least a portion of the drain electrode are formed in the semiconductor fin structure;

a covering layer formed on the semiconductor fin structures and also on two side surfaces of each gate structure, wherein the covering layer includes a first portion formed on the two side surfaces of each dummy gate structure and a second portion formed on the plurality of semiconductor fin structures, and the projection of the source electrode and the drain electrode has no overlap with the projection of the covering layer on the corresponding semiconductor fin structure of the plurality of semiconductor fin structures; and an interlayer dielectric layer formed on the covering layer, wherein the interlayer dielectric layer covers each source electrode and each drain electrode, a trench is formed in the interlayer dielectric layer to expose a portion of each semiconductor fin structure, and a gate structure is formed in each trench, wherein:

each of the source electrode and the drain electrode is formed between the first portion and the second portion of the covering layer, and has a top surface and side surfaces directly covered by the interlayer dielectric layer;

a first portion of the interlayer dielectric layer is sandwiched directly by the source electrode and the first portion of the cover layer, and a second portion of the interlayer dielectric layer is sandwiched directly by the drain electrode and the first portion of the cover layer.

14. The semiconductor device according to claim 13, wherein:

a first gap is formed between the source electrode and the first portion of the cover layer, and the first gap is filled up with the first portion of interlayer dielectric layer.

15. The semiconductor device according to claim 13, wherein:

a second gap is formed between the drain electrode and the first portion of the cover layer, and the second gap is filled up with the second portion of interlayer dielectric layer.

16. The semiconductor device according to claim 1, wherein:

each gate structure includes a gate dielectric layer covering the portion of the semiconductor fin structure exposed in the trench and a metal gate electrode formed on the gate dielectric layer.

17. The semiconductor device according to claim 13, wherein:

the covering layer is made of a material including one or more silicon nitrides; and a thickness of the covering layer is in a range of approximately 80 Å to 140 Å.

18. The semiconductor device according to claim 13, wherein:

the first portion of the covering layer includes a source-side portion formed between the source electrode and the gate structure and a drain-side portion formed between the drain electrode and the gate structure.

19. The semiconductor device according to claim 18, wherein:

a portion of the interlayer dielectric layer separates the source electrode from the source-side portion of the covering layer, and another portion of the interlayer dielectric layer separates the drain electrode from the drain-side portion of the covering layer.

20. The semiconductor device according to claim 18, wherein:
 a distance from the source electrode to the source-side portion of the covering layer is in a range of approximately 20 Å to 60 Å; and
 a distance from the drain electrode to the drain-side portion of the covering layer is in a range of approximately 20 Å to 60 Å.

* * * * *